United States Patent
Kang et al.

(10) Patent No.: US 8,009,781 B2
(45) Date of Patent: Aug. 30, 2011

(54) DTV RECEIVER AND METHOD OF PROCESSING SIGNAL IN DTV RECEIVER

(75) Inventors: Kyung Won Kang, Seoul (KR); In Hwan Choi, Gyeonggi-do (KR); Kook Yeon Kwak, Gyeonggi-do (KR); Young Jin Hong, Seoul (KR); Sung Ryong Hong, Gyeonggi-do (KR)

(73) Assignee: LG Electronics, Inc., Seoul (KR)

( * ) Notice: Subject to any disclaimer, the term of this patent is extended or adjusted under 35 U.S.C. 154(b) by 893 days.

(21) Appl. No.: 11/549,070

(22) Filed: Oct. 12, 2006

(65) Prior Publication Data

US 2007/0127598 A1 Jun. 7, 2007

Related U.S. Application Data

(60) Provisional application No. 60/825,263, filed on Sep. 11, 2006.

(30) Foreign Application Priority Data

Oct. 12, 2005 (KR) .................. 10-2005-0096300

(51) Int. Cl.
*H04B 1/10* (2006.01)
(52) U.S. Cl. .................................. 375/350
(58) Field of Classification Search .......... 375/350
See application file for complete search history.

(56) References Cited

U.S. PATENT DOCUMENTS

| 7,593,474 | B2* | 9/2009 | Jeong et al. | 375/265 |
| 2004/0090997 | A1* | 5/2004 | Choi et al. | 370/535 |
| 2006/0083189 | A1* | 4/2006 | Laroia et al. | 370/319 |
| 2006/0269012 | A1* | 11/2006 | Kim et al. | 375/270 |
| 2008/0301477 | A1* | 12/2008 | Gade et al. | 713/320 |

\* cited by examiner

*Primary Examiner* — Dac V Ha
*Assistant Examiner* — Tanmay K Shah
(74) *Attorney, Agent, or Firm* — Lee, Hong, Degerman, Kang & Waimey

(57) ABSTRACT

A DTV receiver includes a tuner, a demodulator, a channel equalizer, a sequence detector, and a burst controller. The tuner receives a DTV signal having main data and at least one burst of enhanced data. The demodulator demodulates the DTV signal by performing carrier and time recovery and the channel equalizer equalizes the demodulated signal. The sequence detector detects one or more known data sequences from any one of the received signal and the demodulated signal. The demodulator and the channel equalizer use the detected known data sequences when performing the carrier and timing recover and the channel-equalization, respectively. Lastly, the burst controller supplies power to the tuner, the demodulator, the channel equalizer, and the data detector only during a burst time for each burst of enhanced data for efficient power consumption.

24 Claims, 7 Drawing Sheets

(a)

(b)

DTV RECEIVER AND METHOD OF PROCESSING SIGNAL IN DTV RECEIVER

This application claims the benefit of the Korean Patent Application No. 10-2005-0096300, filed on Oct. 12, 2005, which is hereby incorporated by reference as if fully set forth herein. This application also claims the benefit of U.S. Provisional Application No. 60/825,263, filed on Sep. 11, 2006, which is hereby incorporated by reference.

BACKGROUND OF THE INVENTION

1. Field of the Invention

The present invention relates to a digital telecommunications system, and more particularly, to a DTV receiver and method of processing signal in DTV receiver 2. Discussion of the Related Art Since the second half of 1998, the United States of America has adopted an advanced television systems committee (ATSC) VSB (Vestigial Sideband) transmission method as the 1995 standard for digital broadcasting. Presently, the Republic of Korea is also providing broadcast programs by adopting the ATSC 8T-VSB transmission method as the standard for broadcasting. Accordingly, experimental broadcasting began in May 1995, and a test-broadcasting system began on Aug. 31, 2000.

FIG. 1 illustrates a conventional ATSC 8T-VSB transmitting system. A data randomizer randomizes MPEG video/audio data that are inputted. A Reed-Solomon encoder Reed-Solomon encodes data so as to add a 20-byte parity code. A data interleaver interleaves the data. A Trellis encoder converts the data from bytes to symbols and, then, Trellis encodes the converted data. A multiplexer (MUX) multiplexes a symbol column and synchronization signals, and a pilot inserter adds a pilot signal to the symbol column. A VSB modulator converts the symbol column to an 8VSB signal of an intermediate frequency bandwidth. And, a RF converter converts the VSB-converted signal to an RF bandwidth signal and transmits the RF bandwidth-converted signal to an antenna.

FIG. 2 illustrates a structure of a general VSB transmission frame. Herein, one frame consists of two fields, wherein each field includes one field synchronization segment and 312 data segments. The 8T-VSB transmission mode, which is adopted as the standard for digital broadcasting in North America and the Republic of Korea, is a system that has been developed for the transmission of MPEG video/audio data. However, presently, the technology for processing digital signals is being developed at a vast rate, and, as a larger number of the population uses the Internet, digital electric appliances, computers, and the Internet are being integrated. Therefore, in order to meet with the various requirements of the users, a system that can add video/audio data through a digital television channel so as to transmit diverse additional information needs to be developed.

Some users may assume that additional data broadcasting would be applied by using a PC card or a portable device having a simple in-door antenna attached thereto. However, when used indoors, the intensity of the signals may decrease due to a blockage caused by the walls or disturbance caused by approaching or proximate mobile objects. Accordingly, the quality of the received digital signals may be deteriorated due to a ghost effect and noise caused by reflected waves. However, unlike the general video/audio data, when transmitting the additional data, the data that is to be transmitted should have a low error ratio. More specifically, in case of the video/audio data, errors that are not perceived or acknowledged through the eyes or ears of the user can be ignored, since they do not cause any or much trouble. Conversely, in case of the additional data (e.g., program execution file, stock information, etc.), an error even in a single bit may cause a serious problem. Therefore, a system highly resistant to ghost effects and noise is required to be developed.

The additional data are generally transmitted by a time-division method through the same channel as the MPEG video/audio data. However, with the advent of digital broadcasting, ATSC VSB digital television receivers that receive only MPEG video/audio data are already supplied to the market. Therefore, the additional data that are transmitted through the same channel as the MPEG video/audio data should not influence the conventional ATSC VSB receivers that are provided in the market. In other words, this may be defined as ATSC VSB compatibility, and the additional data broadcast system should be compatible with the ATSC VSB system. Herein, the additional data may also be referred to as enhanced data or E-VSB data. Furthermore, in a poor channel environment, the receiving quality of the conventional ATSC VSB receiving system may be deteriorated. More specifically, resistance to changes in channels and noise is more highly required when using portable and/or mobile receivers.

SUMMARY OF THE INVENTION

Accordingly, the present invention is directed to a digital broadcasting system and receiving method that substantially obviate one or more problems due to limitations and disadvantages of the related art.

An object of the present invention is to provide a digital television system that is suitable for transmitting additional data and that is highly resistant to noise.

Another object of the present invention is to provide a digital broadcasting system and receiving that can insert known data in a specific area of the additional data and transmitting the data to a transmitter/receiver, thereby enhancing the receiving quality of the digital television system.

A further object of the present invention is to provide a digital broadcasting system and receiving method for time-division multiplexing and transmitting enhanced data including main data and known data.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) receiver includes a tuner, a demodulator, a channel equalizer, a sequence detector, and a burst controller. The tuner receives a digital television (DTV) signal, in which main data and one or more burst of enhanced data are multiplexed, from a DTV transmitter. Each burst of enhanced data includes one or more groups of consecutive enhanced data packets. Next, the demodulator demodulates the DTV signal by performing carrier and timing recovery, and the channel equalizer channel-equalizes the demodulated DTV signal.

The sequence detector detects one or more known data sequences from any one of the signal received by the tuner and the demodulated signal. The demodulator and the channel equalizer use the detected know data sequences when performing the carrier and timing recovery and the channel equalization, respectively. Lastly, the burst controller supplies power to the tuner, the demodulator, the channel equalizer, and the data detector only during a burst time for each burst of enhanced data.

The DTV receiver may further include an information detector detecting first information which specifies the burst time. In a first example, the information detector detects the first information from a field synchronization segment included in the demodulated signal and provides the detected first information to the burst controller. Alternatively, the information detector detects the first information from each group of consecutive enhanced data packets included in the channel-equalized signal and provides the detected first information to the burst controller. The information detector may further detect second information associated with the known data sequences from the demodulated signal or from the channel-equalized signal and provide the detected second information to the sequence detector.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, enhanced data can correspond to such data having information such as a program execution file, stock information and the like or may correspond to video/audio data. And, known data is the data previously known by agreement between transmitting and receiving sides. Moreover, main data is the data receivable by a conventional receiving system and includes video/audio data.

The present invention relates to inserting known data known by the transmitter/receiver in a specific area of an enhanced data packet and transmitting the processed data packet, so that the processed data is used in the receiver, thereby enhancing the receiving performance of the receiving system. Most particularly, the present invention relates to grouping at least one enhanced data packet and transmitting at least one data packet group in burst units from the transmitting end (or transmitter). When the receiving end (or receiver) receives only the enhanced data, the power is turned on only during the burst section. Thus, by turning the power off during the remaining sections, power consumption of the receiver may be reduced. Herein, at least one of only the enhanced data packet groups within one burst may be multiplexed, or at least one enhanced data packet group and main data packets may be multiplexed.

Figure 3:
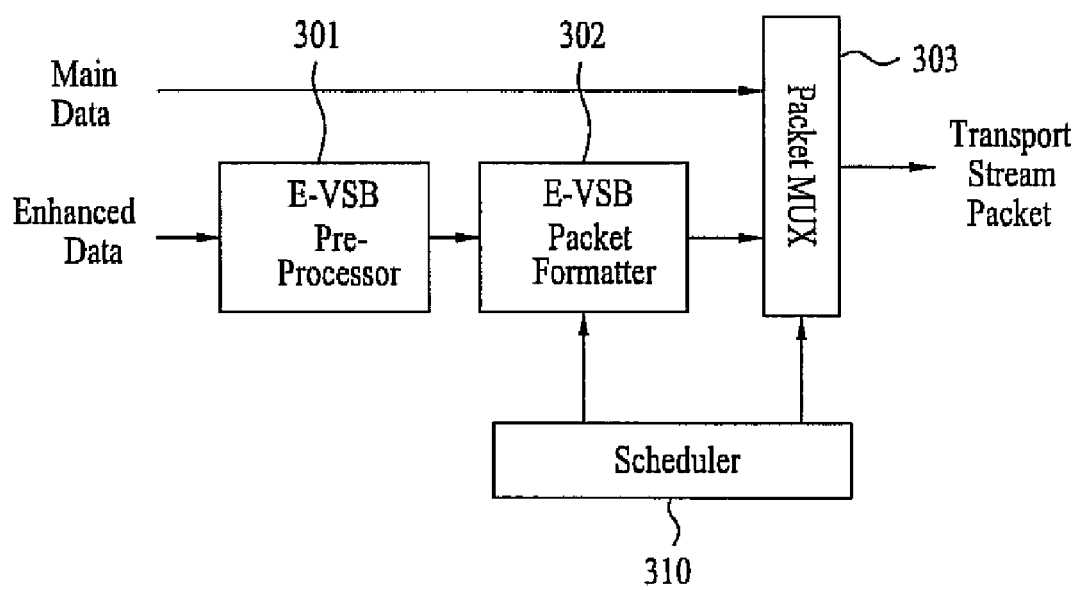
FIG. 3 illustrates a block view of a multiplexing device according to an embodiment of the present invention.

FIG. 3 illustrates a block view of a multiplexing device according to an embodiment of the present invention. The multiplexing device includes an E-VSB pre-processor 301, an E-VSB packet formatter 302, a packet multiplexer 303, and a scheduler 310. In the multiplexing device having the above-described structure, main data are outputted to the packet multiplexer 303 in transport packet units, and enhanced data are outputted to E-VSB pre-processor 301. The E-VSB pre-processor 301 pre-processes the enhanced data, such as encoding additional error correction, interleaving, and inserting null data, and then outputs the pre-processed enhanced data to the E-VSB packet formatter 302.

Based upon the control of the scheduler 310, the E-VSB packet formatter 302 multiplexes the pre-processed enhanced data and the pre-defined known data, thereby configuring a group. The data within the group are then divided into 184-byte unit enhanced data packets, and a 4-byte MPEG header is added to the beginning of the enhanced data packet, thereby outputting a 188-byte enhanced data packet (i.e., a MPEG compatibility packet). In other words, one enhanced data packet group includes a plurality of consecutive enhanced data packets. The output of the E-VSB packet formatter 302 is inputted to the packet multiplexer 303. The packet multiplexer 303 time-division multiplexes the main data packet and the enhanced data packet in transport stream (TS) packet units and outputs the multiplexed TS packet. More specifically, the scheduler 310 generates and outputs a control signal so that the packet formatter 302 can multiplex the enhanced data and the known data. The scheduler 310 also generates and outputs a control signal, so that the packet multiplexer 303 can multiplex the main data packet and the enhanced data packet. Accordingly, the packet multiplexer 303 receives the control signal, thereby multiplexing and outputting the grouped main data packet and enhanced data packet to TS packet units.

At this point, based upon the control of the scheduler 310, a transmission parameter for multiplexing the packet formatter 302 and the packet multiplexer 303 may be multiplexed along with the multiplexing of the enhanced data and the known data. Alternatively, a transmission parameter may also be multiplexed and outputted when the main data packet and the enhanced data packet group are multiplexed by the packet multiplexer 303. Furthermore, the transmission parameter may also be inserted in a reserved area of the ATSC VSB field synchronization segment and then transmitted. More specifically, the transmission parameter may be inserted in a pre-decided position (or place) of a particular group and then transmitted, and/or be inserted in a reserved area of the field synchronization segment and then transmitted. Herein, the transmission parameter may include information of the length of a current burst, information indicating a starting point of a next burst, the place in which the groups exists within the burst and the length of each group, the time starting from the current group to the next group within the burst, and information on the known data. Either a predetermined value or a real-time variable value may be used for each of the various parameters.

Figure 4:
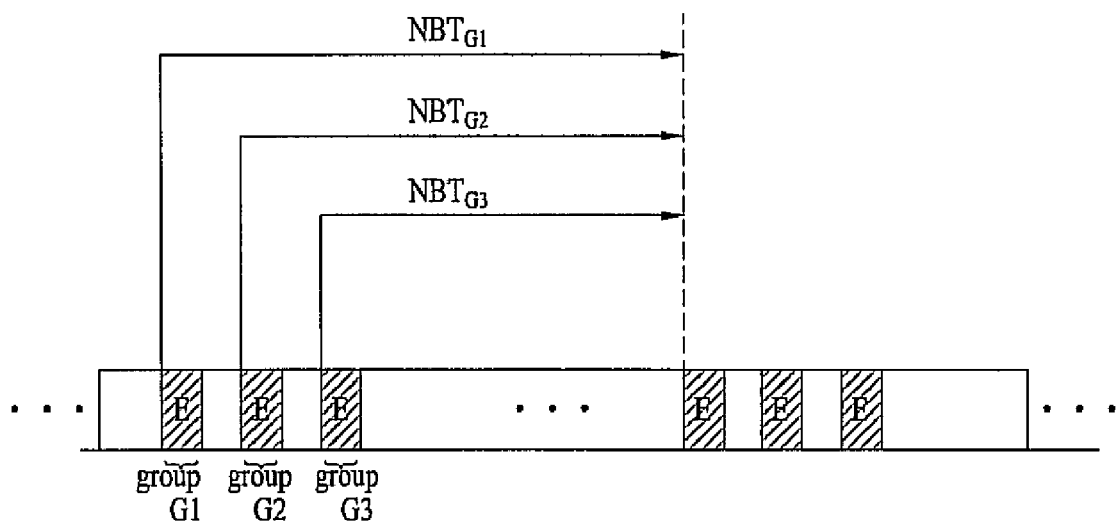
FIG. 4 illustrates examples (a) and (b) of a multiplexing method of the multiplexing device shown in FIG. 3.
Figure 4:
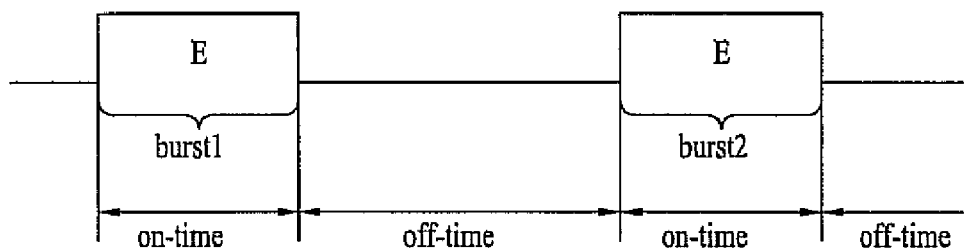

FIG. 4 illustrates examples of a multiplexing method of the multiplexing device. Referring to FIG. 4, a group consists of a plurality of consecutive enhanced data packets, wherein the data packet groups are grouped (or gathered) to form a burst. Herein, the consecutive enhanced data packets are multiplexed in group units in order to maximize the receiving performance of the receiving system. More specifically, when the known data inserted by the E-VSB packet formatter 302 are Trellis encoded by the digital broadcast transmitting system, so as to be finally transmitted. Herein, the known data are consecutively transmitted, thereby maximizing the receiving performance of the receiving system.

If the length of the enhanced data packet group (i.e., the number of enhanced data packets within the group) is too long (or large), a problem of compatibility may occur with the conventional ATSC digital broadcast receiver which receives the main data packet(s). More specifically, the conventional ATSC digital broadcast receiver refers to a packet identifier (PID) of the enhanced data packet and deletes (or discards) the enhanced data packet accordingly. However, if a main data packet is not received for a long period of time, a problem may occur in the controlling of a buffer. Therefore, according to an embodiment of the present invention, enhanced data packets having a length equal to or shorter than a predetermined length are multiplexed in group units, and the multiplexed data packet group is multiplexed with a main data packet within a burst and then outputted.

Furthermore, referring to FIG. 4, a next burst time (NBT) signifies a time starting from each enhanced data packet group within a current burst to the starting time of the following (or next) burst. In the present invention, a next burst time (NBT) is inserted in each group within the current burst and then transmitted. Herein, the NBT is set to be inserted in a pre-decided area of the corresponding group. Such NBT is decided in the scheduler 310 and provided to the E-VSB packet formatter 302. The E-VSB packet formatter 302 then inputs the NBT in a specific area of the enhanced data packet group, which is then outputted. As shown in FIG. 4, the NBT decreases as it proceeds from G1 of the current burst (burst 1) to G2 and G3 (i.e., $NBT_{G1} > NBT_{G2} > NBT_{G3}$). At this point, the NBT is repeatedly inserted within each group in order to allow the receiver to identify the NBT by receiving of another group even when an error occurs during the reception of the corresponding group.

Figure 5:
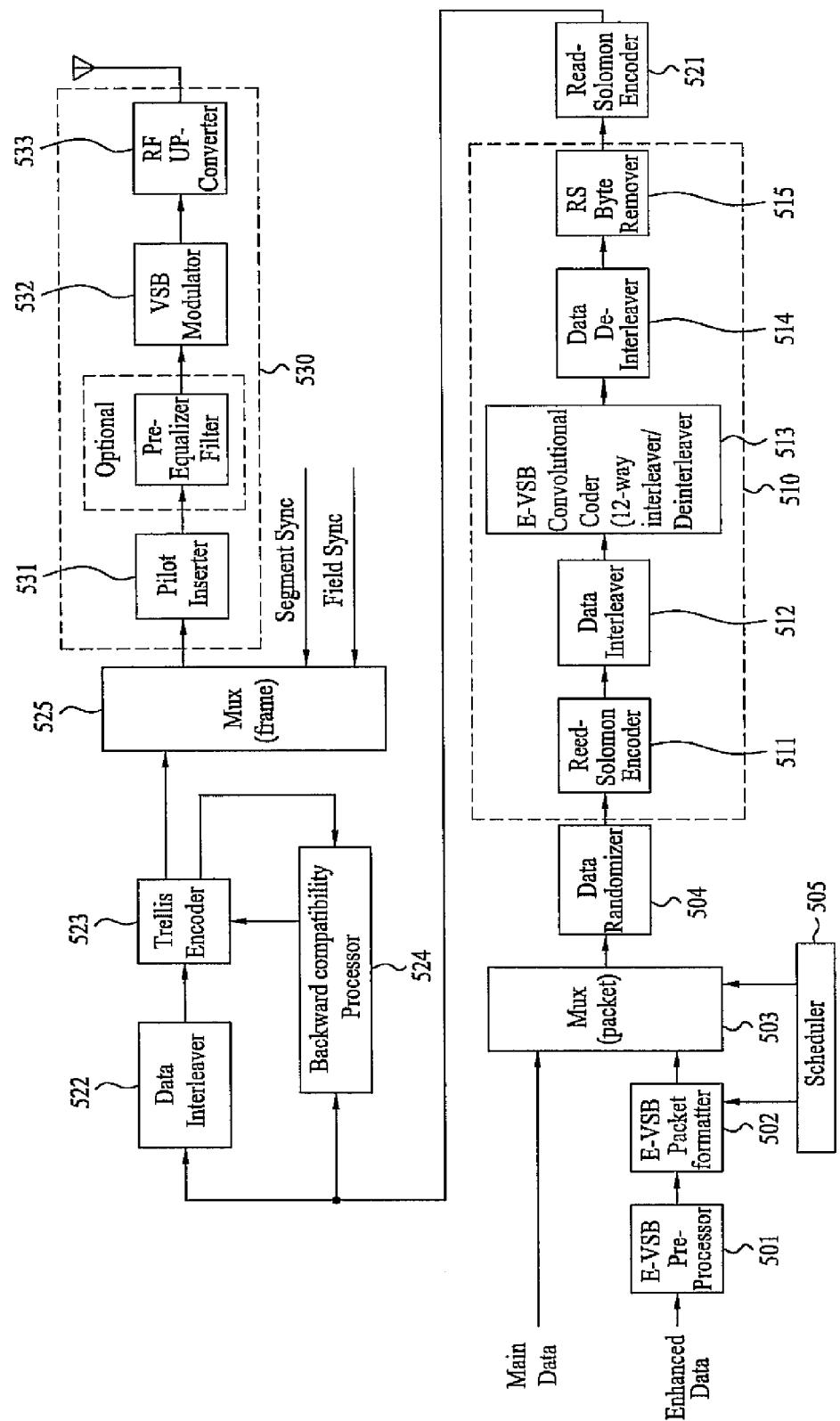
FIG. 5 illustrates a block view of a digital broadcast transmitting system according to an embodiment of the present invention.

FIG. 5 illustrates a block view of a digital broadcast transmitting system according to an embodiment of the present invention, wherein the multiplexing device of FIG. 3 is applied. The digital broadcast transmitting system includes an E-VSB pre-processor 501, an E-VSB packet formatter 502, a packet multiplexer 503, a data randomizer 504, a scheduler 505, an E-VSB post-processor 510, a Reed-Solomon (RS) encoder 521, a data interleaver 522, a Trellis encoder 523, a backward compatibility processor 524, a frame multiplexer 525, and a transmitter 530. Since the operation of each of the E-VSB pre-processor 501, the E-VSB packet formatter 502, the packet multiplexer 503, the data randomizer 504, and the scheduler 505 has already been described in detail, the description of the same will be omitted for simplicity.

The data outputted from the packet multiplexer 503 passes through the data randomizer 504 and are outputted to the E-VSB post-processor 510.

Herein, the E-VSB post-processor 510 includes a Reed-Solomon (RS) encoder 511, a data interleaver 512, an E-VSB convolutional encoder 513, a data deinterleaver 514, and a RS byte remover 515. The RS encoder 511 RS-codes the data outputted from the data randomizer 504. Thereafter, the RS encoder 511 adds 20-byte parity data and outputs the data to the data interleaver 512.

The data interleaver 512 interleaves the data packet having the parity data bytes added thereto and being outputted. Thereafter, the data interleaver 512 outputs the interleaved data packet to the E-VSB convolutional encoder 513. Herein, the output data of the data interleaver 512 are outputted to the E-VSB convolutional encoder 513. Then, the E-VSB convolutional-encoded data pass through the data interleaver 514 and are outputted to the RS byte remover 515, thereby removing (or deleting) the 20-byte parity data. The E-VSB convolutional encoder 513 converts the inputted bytes to symbols. Subsequently, E-VSB convolutional-encoding is performed only on the enhanced data symbols, which are then converted back to bytes from symbols so as to be outputted. More specifically, the E-VSB convolutional encoder 513 outputs data without modifying the data when the output of the data interleaver 512 is the main data, or when the output of the data interleaver 512 is the known data that were inserted in the enhanced data packet. Further, the E-VSB convolutional encoder 513 also outputs the MPEG header byte added by the E-VSB packet formatter and the RS parity byte added to the enhanced data packet by the RS encoder 511 without modifying the corresponding data.

The RS byte remover 515 removes the 20-byte parity data, which were added to the corresponding data by the RS encoder 511, and outputs the parity-removed input data to the RS encoder 521. The RS encoder 521 RS-codes the input data so as to add the 20-byte parity data once again to the input data. Then, the RS encoder 521 outputs the parity-added data to the data interleaver 522. The data interleaved by the data interleaver 522 are inputted to the trellis encoder 523. The trellis encoder 523 trellis-encodes the inputted 2 bits to 3 bits and outputs the trellis-encoded data (i.e., 3 bits) to the frame multiplexer 525. In order to make the data outputted from the trellis encoder 523 as the known data defined from the transmitting/receiving ends, a memory within the trellis encoder 523 needs to be initialized with respect to the known data inserted in the E-VSB packet.

Figure 1:
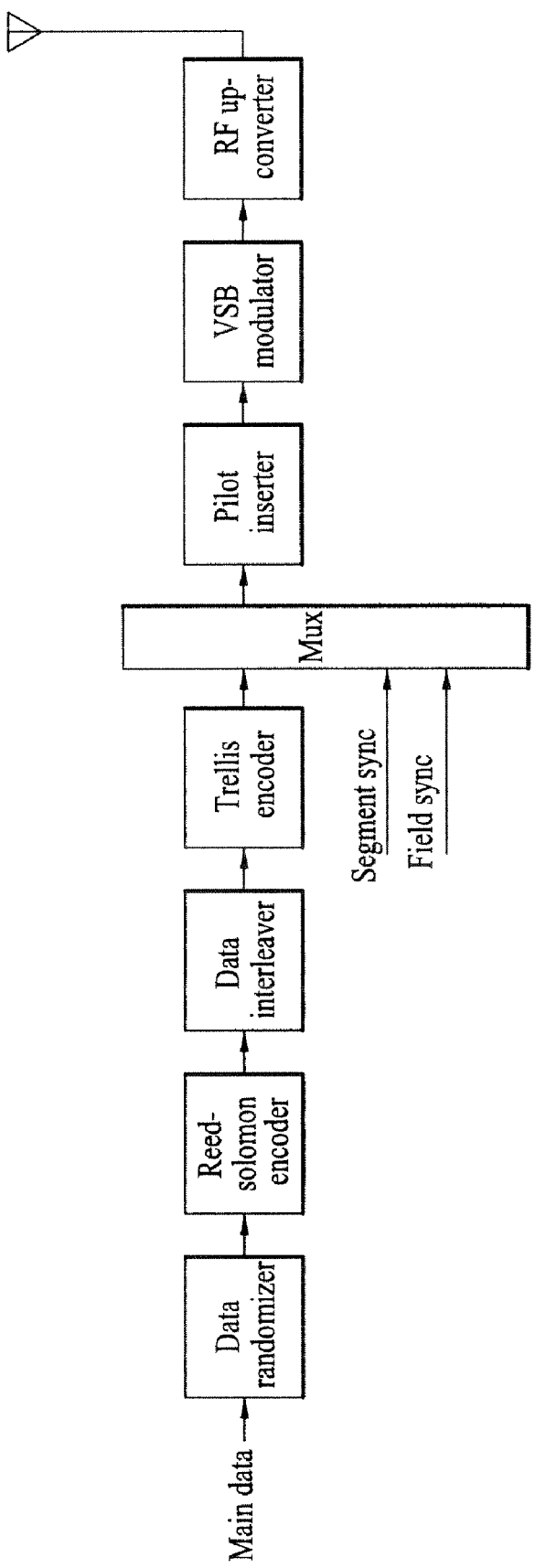
FIG. 1 illustrates a block view of a general digital broadcast transmitting system.
Figure 2:
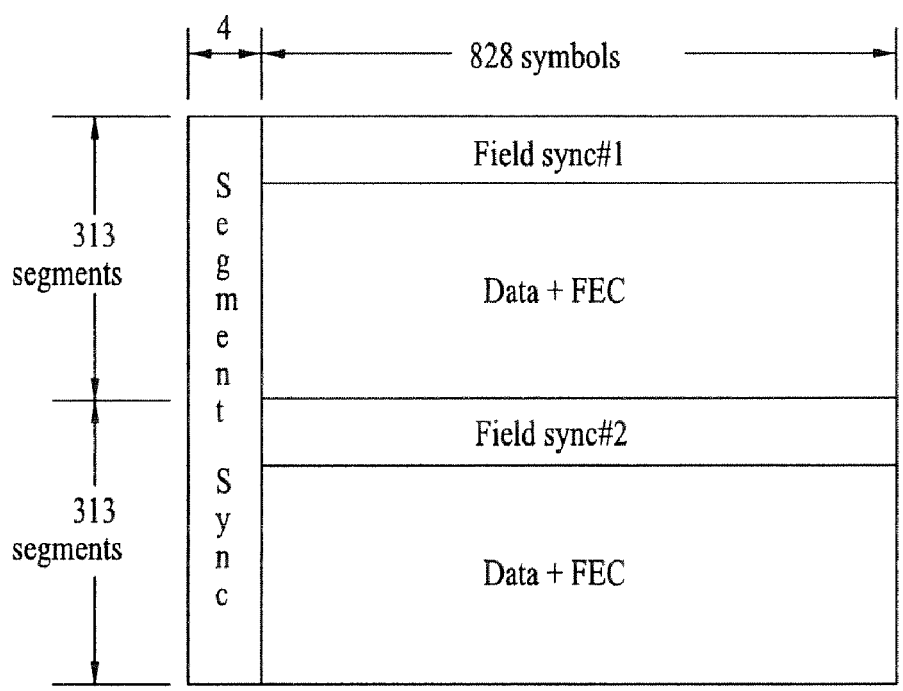
FIG. 2 illustrates a structure of a general VSB transmission frame.

At this point, initialization is performed by a new set of data and not by the input data. Therefore, a new set of RS parity data should be created and be replaced with the initial parity data. More specifically, this operation is performed by the backward-compatibility processor 324. The output of the trellis encoder 523 is inputted to the frame multiplexer 525. Then, the frame multiplexer 525 inserts field and segment synchronization signals to the output data of the trellis encoder 523 and outputs the data to the transmitter 530. Herein, the transmitter 530 includes a pilot inserter 531, a VSB modulator 533, and a radio frequency (RF) converter 534. Since this structure is similar to the digital television transmitter of FIG. 1, a detailed description of the same will be omitted for simplicity. As another embodiment of the present invention, the multiplexing device of FIG. 5 may be applied in the digital television transmitter, thereby being capable of multiplexing and transmitting the enhanced data packet and the main data packet.

Figure 6:
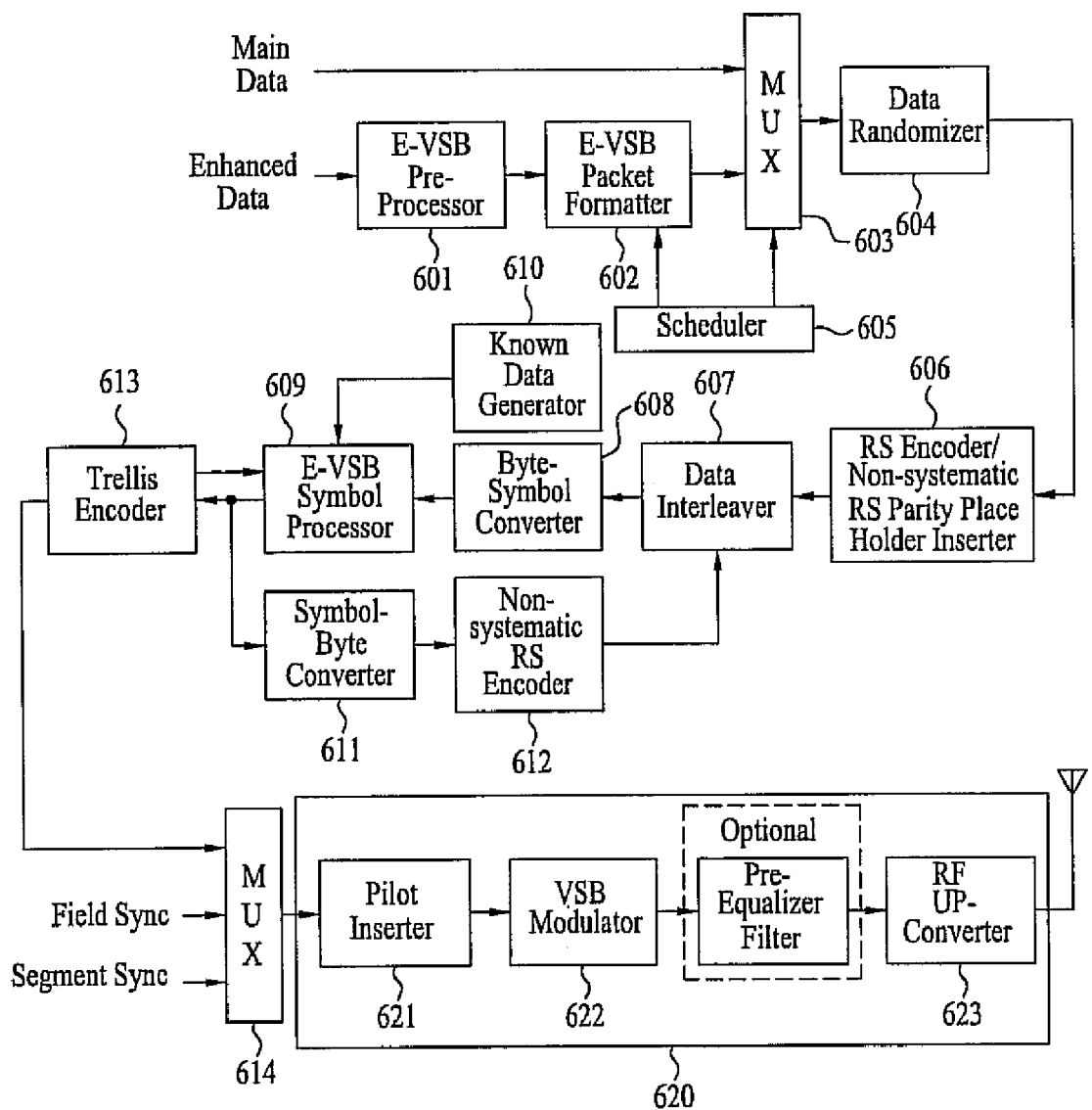
FIG. 6 illustrates a block view of a digital broadcast transmitting system according to another embodiment of the present invention.

FIG. 6 illustrates a block view of a digital broadcast transmitting system according to another embodiment of the present invention, wherein the multiplexing device of FIG. 3 is applied. The digital broadcast transmitting system includes an E-VSB pre-processor 601, an E-VSB packet formatter 602, a packet multiplexer 603, a data randomizer 604, a scheduler 605, a RS encoder/parity place holder inserter 606, a data interleaver 607, a byte-symbol converter 608, an E-VSB symbol processor 609, a known data generator 610, a symbol-byte converter 611, a non-systematic RS encoder 612, a Trellis encoder 613, a frame multiplexer 614, and a transmitter 620.

The E-VSB packet formatter 602 of FIG. 6 decides the known data place holder in which the known data within the packet is to be inserted. Then, the E-VSB packet formatter 602 inserts a null data in the decided known data place holder, so as to be multiplexed with the output data of the E-VSB pre-processor 601, thereby configuring a group. Subsequently, the data within the group are divided into a 184-byte unit enhanced data packets. Thereafter, a 4-byte MPEG header byte is added to the beginning of the enhanced data packet, thereby outputting a 188-byte enhanced data packet (i.e., a MPEG compatibility packet). In other words, one enhanced data packet group includes a plurality of consecutive enhanced data packets.

Since the operation of each of the packet multiplexer 603 and the scheduler 605 has already been described in detail in the operation of the packet multiplexer and scheduler of FIG. 3, the description of the same will be omitted for simplicity.

The output of the packet multiplexer 603 is randomized by the data randomizer 604. Then, the randomized data are inputted to the Reed-Solomon (RS) encoder/parity place holder inserter 606. The RS encoder/parity place holder inserter 606 processes the randomized data with either a systematic RS-coding process or a non-systematic parity place holder insertion process. More specifically, when the 187-byte packet that is outputted from the data randomizer 604 corresponds to the main data packet, the RS encoder/parity place holder inserter 606 performs the same systematic RS-coding as the conventional ATSC VSB system, thereby adding 20-byte parity data at the end of the 187-byte data.

Conversely, when the 187-byte packet that is outputted from the data randomizer 604 corresponds to the enhanced data packet, a position (or place) of a parity data byte within the packet is decided so that the 20 parity data bytes are outputted from the output terminal of the data interleaver 607 later than the 187 data bytes. Then, a null data byte is inserted in the decided parity byte position (or place). Further, the 187 data bytes received from the data randomizer 604 are sequentially inserted in the remaining 187 byte positions.

The null data byte is given an arbitrary value, and such null data byte value is substituted with the parity value calculated by the non-systematic RS encoder 612 in a later process. Accordingly, the role of the null data byte is to ensure the parity byte position (or place) of a non-systematic RS code. The non-systematic RS code is used for the enhanced data packet for the following reason. When the value of the enhanced data is changed by the E-VSB symbol processor 609, which will be described in detail in a later process, the RS parity should be recalculated. And so, the parity bytes should be outputted from the data interleaver 607 output terminal later than the data bytes.

The output data of the RS encoder/parity place holder inserter 606 are outputted to the data interleaver 607. Then, the data interleaver 607 interleaves and outputs the received data. At this point, the data interleaver 607 receives a RS parity byte that is newly calculated and outputted by the non-systematic RS encoder 612 and, then, substitutes the newly received RS parity byte for the non-systematic RS parity place holder which is not yet outputted. More specifically, the data interleaved 187 information bytes are first outputted. Thereafter, the 20 parity place holders in which a null data byte is respectively inserted are replaced with the newly calculated 20 RS parity bytes and then outputted.

Each data byte outputted from the data interleaver 607 is converted into 4 symbols by the byte-symbol converter 608, which are then outputted to the E-VSB symbol processor 609. Herein, one symbol consists of 2 bits. Additionally, the known data sequence generated (or created) from the known data generator 610 is also outputted to the E-VSB symbol processor 609. The E-VSB symbol processor 609 receives the data outputted from the byte-symbol converter 608 and the known data symbol generated from the known data generator 610, processes the received data with a plurality of processing steps, and then outputs the processed data to the trellis encoder 613 and the symbol-byte converter 611, respectively. For example, when the data that are outputted from the byte-symbol converter 608 correspond to a known data place holder in which null data are inserted, the E-VSB symbol processor 609 selects the known data generated from the data generator 610 instead of the known data place holder. Then, the E-VSB symbol processor 609 outputs the selected known data to the trellis encoder 613 and the symbol-byte converter 611.

In the portion where the known data symbol begins, the E-VSB symbol processor 609 generates a data symbol that initializes a memory of the trellis encoder 613 to a predetermined state. Thereafter, the E-VSB symbol processor 609 outputs the generated data symbol instead of the known data symbol. In order to do so, the value of the memory in the trellis encoder 613 should be received from the E-VSB symbol processor 609. The trellis encoder 613 is initialized at the beginning of the known data sequence because, even though the known data sequence is inputted as the input of the trellis encoder 613, a plurality of output sequences may be outputted depending upon the memory state of the trellis encoder 613. Therefore, when the known data are inputted after the memory state of the trellis encoder 613 is initialized to a predetermined value, the known data output sequence may be obtained from the output of the trellis encoder 613.

The trellis encoder 613 pre-codes the data that are inputted as the upper bit among the output symbol of the E-VSB symbol processor 608, and trellis-encodes the data that are inputted as the lower bit. Thereafter, the pre-coded data and the trellis-encoded data are outputted to the frame multiplexer 614. Meanwhile, the E-VSB symbol processor 609 receives the symbol consisting of 2 bits, processes the received symbol with a plurality of process steps, and outputs the processed symbol. Therefore, the symbol should be converted back to data bytes from the symbol-byte converter 611 so that the non-systematic RS encoder 612 can recalculate the RS parity from the output of the E-VSB symbol processor 609. The non-systematic RS encoder 612 calculates the 20-byte RS parity for the data packet configured of 187 information bytes and outputs the calculated RS parity to the data interleaver 607.

The frame multiplexer 614 inserts 4 segment synchronization symbols in each 828 output symbols of the trellis encoder 613, thereby configuring a data segment having 832 data symbols. More specifically, one field synchronization segment is inserted in each 312 data segments, so as to configure one data field, which is then outputted to the transmitter 620. Herein, the transmitter 620 includes a pilot inserter 621, a VSB modulator 622, and a radio frequency (RF) converter 623.

Meanwhile, the enhanced data packet is transmitted in burst units so as to allow the power of the receiver to be turned on only during the burst period when using a receiver that only receives the enhanced data. This characteristic is advantageous in portable or mobile receivers which require low power consumption.

Figure 7:
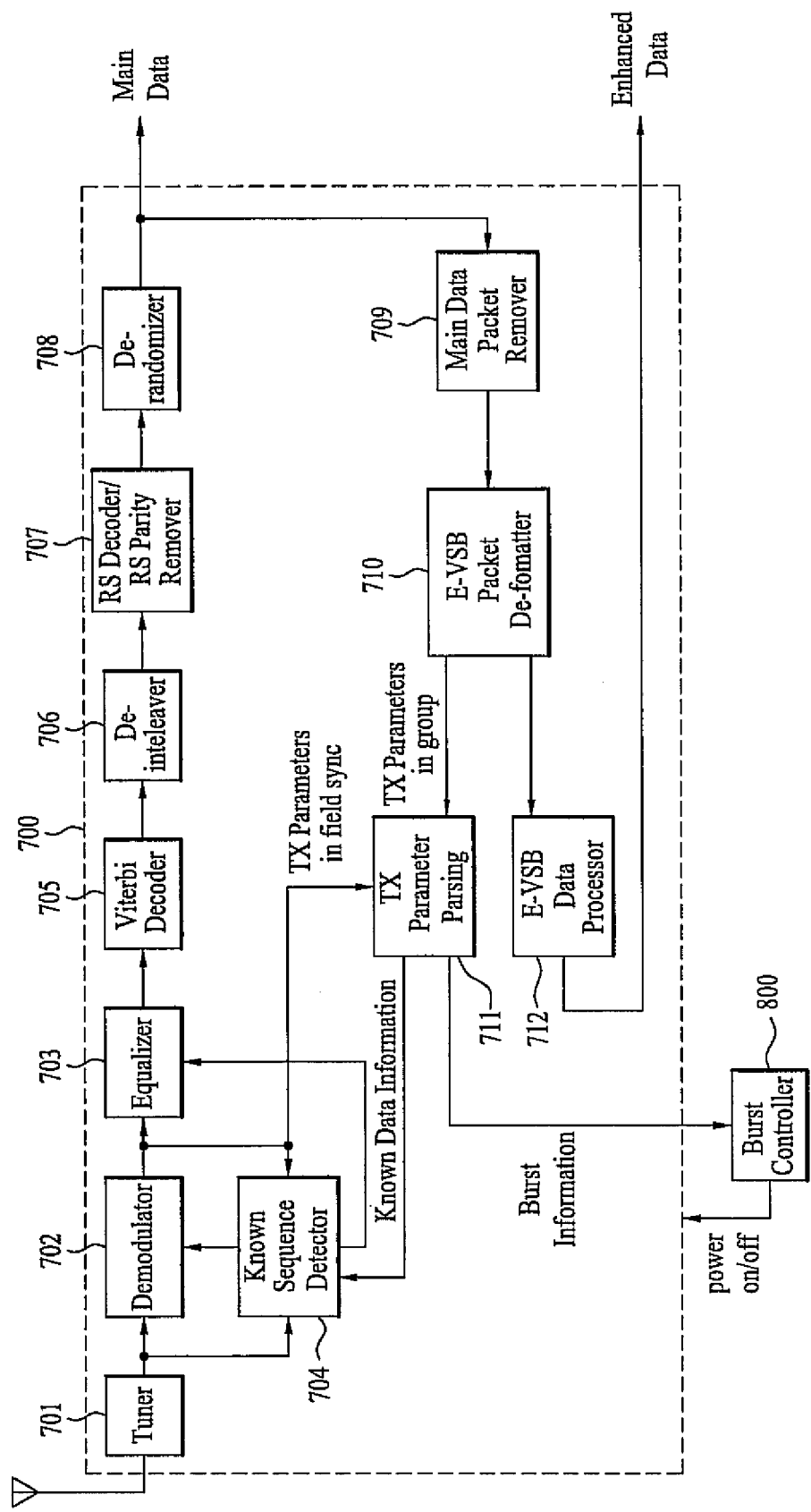
FIG. 7 illustrates a digital broadcast receiving system according to an embodiment of the present invention.

FIG. 7 illustrates a digital broadcast receiving system according to an embodiment of the present invention. Referring to FIG. 7, the digital broadcast receiving system broadly includes a receiver 700 and a burst controller 800, the burst controller 800 controlling the power supply to the receiver 700. The receiver 700 includes a tuner 701, a demodulator 702, an equalizer 703, a known data (or sequence) detector 704, a Viterbi decoder 705, a data deinterleaver 706, a RS decoder/RS parity remover 707, and a derandomizer 708. The receiver 700 also includes a main data packet remover 709, an E-VSB packet deformatter 710, a parameter detector 711, and an enhanced data processor 712.

The tuner 701 tunes the frequency of a particular channel. Subsequently, the tuner 701 down-converts the tuned frequency and outputs the tuned channel frequency to the demodulator 702 and the known data detector 704. The demodulator 702 performs carrier recovery and timing recovery of the tuned channel frequency, and outputs the processed channel frequency to the equalizer 703 and the known data detector 704. If the transmission parameters corresponding to the known data, the enhanced data packet group, and the burst are included and transmitted in the field synchronization segment, the information is outputted to the parameter detector 711. The equalizer 703 performs compensation for any channel distortion included in the demodulated signal and outputs the compensated signal to the Viterbi decoder 705.

At this point, the known data detector 704 detects the known data symbol column, which has been inserted by the transmitting end, from the output data of the tuner 701 and/or the demodulator 702. Then, the known data detector 704 outputs the detected known data symbol column to the demodulator 702 and the equalizer 703. When the demodulator 702 uses the known data during the timing recovery or the carrier recovery, the demodulating performance may be enhanced. Similarly, when the equalizer 703 uses the known data, the equalization performance may be enhanced. The Viterbi decoder 705 Viterbi encodes the data outputted from the equalizer 703 and converts the Viterbi encoded data to bytes. Thereafter, the converted data are outputted to the data deinterleaver 706. The data deinterleaver 706 performs an inverse process of the data interleaver of the transmitting system and outputs the deinterleaved data to the RS decoder/RS parity remover 707.

If the received data packet is the main data packet, the RS decoder/RS parity remover 707 RS decodes the received main data packet. Alternatively, if the received data packet is the enhanced data packet, the RS decoder/RS parity remover 707 removes the parity bytes without performing RS decoding. At this point, the operation of removing the parity bytes may vary depending upon the structure of the digital broadcast transmitting system applied in the present invention. For example, if the enhanced data packet is transmitted from the digital broadcast transmitting system shown in FIG. 5, the last 20 bytes of the corresponding data packet are removed. On the other hand, if the enhanced data packet is transmitted from the digital broadcast transmitting system shown in FIG. 6, the 20 bytes of non-systematic RS parity place holder placed in between data packets are removed. Thereafter, the parity-removed data packet is outputted to the derandomizer 708.

The derandomizer 708 performs an inverse process of the randomizer of the transmitting system on the output of the RS decoder/RS parity remover 707. Thereafter, the derandomizer 708 inserts the MPEG synchronization byte in the beginning of each packet, thereby outputting the data in 188-byte packet units. The output of the derandomizer 708 is simultaneously outputted to the main MPEG decoder (not shown) and to the main data packet remover 709. Herein, the main MPEG decoder only decodes the packet(s) corresponding to the main MPEG. If the packet ID is a null packet ID (i.e., the enhanced data packet), the main MPEG decoder does not perform the decoding process.

In the meantime, the main data packet remover 709 removes the 188-byte main data packet from the data outputted from the derandomizer 708 and outputs only the enhanced data packet to the E-VSB packet deformatter 710. The E-VSB packet deformatter 710 removes the MPEG header from the enhanced data packet outputted by the main data packet remover 709, thereby obtaining a 184-byte data packet. Subsequently, the E-VSB packet deformatter 710 configures a group having a pre-decided size by grouping the 184-byte data packets. Thereafter, the E-VSB packet deformatter 710 removes the known data or known data place holder(s) that have been inserted by the transmitting system (or transmitter) for demodulation and equalization processes. Furthermore, if the transmission parameters corresponding to the known data, the enhanced data packet group, and the burst are inserted in a pre-determined place in each group and then transmitted, the E-VSB packet deformatter 710 outputs such information to the parameter detector 711. In this case, the data having the known data or known data place holder(s) removed are configured of E-VSB pre-processed enhanced data and a transmission parameter including information on a group and a burst.

The parameter detector 711 detects the information on the known data from the transmission parameter that has been multiplexed in the field synchronization segment and/or the data group and also detects the information on the burst. Then, the parameter detector 711 outputs the detected information on the known data to the known data detector 704 and the detected information on the burst to the burst controller 800. At this point, each set of the known data is inserted differently in each packet within the group. Therefore, the information on the group obtained after the E-VSB packet deformatting is detected, so as to receive information on the known data from the known data detector 704. Thus, the received information may be used for detecting the known data. Furthermore, if the known data are inserted in a particular place (or position) by a particular method, the known data are detected prior to extracting the information on the group, so as to be used in the for demodulation and equalization processes. The enhanced data processor 712 performs an inverse process of the E-VSB pre-processor of the transmitting system on the output of the E-VSB packet deformatter 710, thereby performing a final output of the enhanced data.

Depending upon the burst information that is inputted, the burst controller 800 supplies power to the current burst section so that the receiver 700 can be operated. On the other hand, the burst controller 800 shuts down the power supply to the section starting from the end of the current burst section to the next burst section, wherein the enhanced data that are to be received do not exist. Thus, the energy consumed by the receiver may be reduced. More specifically, when only a particular set of enhanced data is to be received in a system having the main data and the enhanced data multiplexed and transmitted thereto, the energy consumed within the section having no desired set of enhanced data is largely reduced. Accordingly, when only the enhanced data are received, the burst controller 800 supplies the power to the receiver 700 during the burst section and shut shuts down the power supply to the receiver 700 during the remaining sections, thereby reducing the power consumption of the receiver. More specifically, data are received only in the burst having the group configured of the enhanced data included therein, whereas the power is not supplied (or shut down) in a pre-determined area of the receiver during the non-burst section, so as to reduce excessive power consumption.

As described above, the digital broadcasting system, method, and data structure according to the present invention have the following advantages. Herein, the digital broadcasting system is highly protected against (or resistant to) any error that may occur when transmitting additional data through a channel, and the digital broadcasting system is also highly compatible to the conventional VSB system. The present invention may also receive the additional data without any error even in channels having severe ghost effect and noise. Additionally, by inserting known data in a specific area of the data area and transmitting the processed data, the receiving performance of the receiving system liable to a frequent change in channel may be enhanced. Furthermore, the present invention is even more effective when applied to mobile and portable receivers, which are also liable to a frequent change in channel and which require protection (or resistance) against intense noise.

Finally, by grouping a plurality of consecutive enhanced data packets and transmitting the grouped packets, the receiving performance of the receiving system may be enhanced. More specifically, by transmitting at least one group in burst units, the performance of a receiving system receiving only the enhanced data. The transmission of the grouped packets transmitted in burst units is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A DTV receiver comprising:
a tuner receiving a DTV signal during a burst time interval in which a data group is multiplexed with main data by cyclically supplying power to the tuner on the burst time interval, the data group including enhanced data, known data sequences and transmission parameter data, wherein the enhanced data results from a process comprising:
RS coding enhanced data for first forward error correction (FEC), convolutional coding the RS-coded enhanced data,
RS coding the convolutional-coded enhanced data for second FEC, interleaving the RS-coded enhanced data for second FEC, and trellis-encoding the interleaved enhanced data;
a known data sequence detector detecting a position of at least one of the known data sequences in the data group in the DTV signal;
a demodulator performing carrier recovery based on at least one of the known data sequences in the data group of the DTV signal;
a channel equalizer channel-equalizing the DTV signal which the carrier recovery is performed on using at least one of the known data sequences in the data group of the DTV signal; and
a power controller supplying power to at least one of the tuner, the demodulator, and the channel equalizer, based on the transmission parameter data inserted in a predetermined place in the DTV signal.

2. The DTV receiver of claim 1, further comprising an information detector detecting first information which specifies a burst time interval for each burst of enhanced data from the demodulated signal and providing the detected first information to the power controller.

3. The DTV receiver of claim 2, wherein the information detector detects the first information from a field synchronization segment included in the demodulated signal.

4. The DTV receiver of claim 2, wherein the information detector further detects second information associated with the known data sequences from the demodulated signal.

5. The DTV receiver of claim 1, further comprising an information detector detecting first information which specifies a burst time interval for each burst of enhanced data from the channel-equalized signal and providing the detected first information to the power controller.

6. The DTV receiver of claim 5, wherein the information detector detects the first information from each group of consecutive enhanced data packets included in the channel-equalized signal.

7. The DTV receiver of claim 5, wherein the information detector further detects second information associated with the known data sequences from the channel-equalized signal.

8. The DTV receiver of claim 5, wherein the first information indicates a time between each group of consecutive enhanced data packets included in a current burst of enhanced data and a next burst of enhanced data.

9. The DTV receiver of claim 5, wherein the first information indicates a length of a current burst of enhanced data.

10. The DTV receiver of claim 5, wherein the first information indicates a location and length of each group of consecutive enhanced data packets.

11. A method of processing a signal in a DTV receiver, the method comprising:
receiving in a tuner a DTV signal during a burst time interval in which a data group is multiplexed with main data by cyclically supplying power to the tuner on the burst time interval, the data group including enhanced data, known data sequences and transmission parameter data, wherein the enhanced data results from a process comprising:
RS coding enhanced data for first forward error correction (FEC), convolutional coding the RS-coded enhanced data,
RS coding the convolutional-coded enhanced data for second FEC, interleaving the RS-coded enhanced data for second FEC, and trellis-encoding the interleaved enhanced data;
detecting a position of at least one of the known data sequences in the data group in the DTV signal;
performing, in a demodulator, carrier recovery based on at least one of the known data sequences in the data group of the DTV signal;

channel-equalizing in a channel equalizer the DTV signal which the carrier recovery is performed on using at least one of the known data sequences in the data group of the DTV signal; and supplying power to at least one of the tuner, the demodulator, and the channel equalizer based on the transmission parameter data inserted in a predetermined place in the DTV signal.

12. The method of claim 11, further comprising detecting first information specifying a burst time interval for each burst of enhanced data from the demodulated signal.

13. The method of claim 12, wherein the first information is detected from a field synchronization segment included in the demodulated signal.

14. The method of claim 12, further comprising detecting second information associated with the known data sequences from the demodulated signal.

15. The method of claim 11, further comprising detecting first information specifying a burst time interval for each burst of enhanced data from the channel-equalized signal.

16. The method of claim 15, wherein the first information is detected from each group of consecutive enhanced data packets included in the channel-equalized signal.

17. The method of claim 15, further comprising detecting second information associated with the known data sequences from the channel-equalized signal.

18. The method of claim 15, wherein the first information indicates a time between each group of consecutive enhanced data packets included in a current burst of enhanced data and a next burst enhanced data.

19. The method of claim 15, wherein the first information indicates a length of a current burst of enhanced data.

20. The method of claim 15, wherein the first information indicates a location and length of each group of consecutive enhanced data packets.

21. The DTV receiver of claim 1, further comprising a sequence detector for detecting the known data sequences from the DTV signal.

22. The method of claim 11, further comprising detecting the known data sequences from the DTV signal.

23. A method of processing digital broadcast data in a DTV receiver, the method comprising:

receiving a DTV signal including enhanced data, known data sequences, and transmission parameter data, wherein the enhanced data results from a process comprising:

RS coding enhanced data for first forward error correction (FEC), convolutional coding the RS-coded enhanced data, RS coding the convolutional-coded enhanced data for second FEC, interleaving the RS-coded enhanced data, and trellis-encoding the interleaved RS-coded enhanced data;

detecting a position of at least one of the known data sequences in the data group in the DTV signal;

demodulating the DTV signal with a VSB modulation scheme and performing carrier recovery based on at least one of the known data sequences in the data group of the DTV signal, wherein the transmission parameter data are inserted in a predetermined place in the DTV signal; and supplying power to at least one of a tuner and a demodulator based on the transmission parameter data.

24. A DTV receiver for processing digital broadcast data, the DTV receiver comprising:

a tuner for receiving a DTV signal including enhanced data, known data sequences, and transmission parameter data, wherein the enhanced data results from process comprising:

RS coding enhanced data for first forward error correction (FEC), convolutional coding the RS-coded enhanced data, RS coding the convolutional-coded enhanced data for second FEC, interleaving the RS-coded enhanced data, and trellis-encoding the interleaved RS-coded enhanced data;

a known data sequence detector detecting a position of at least one of the known data sequences in the data group in the DTV signal; and a demodulator for demodulating the DTV signal with a VSB modulation scheme and performing carrier recovery based on at least one of the known data sequences in the data group of the DTV signal, wherein the transmission parameter data are inserted in a predetermined place in the DTV signal; and a controller for supplying power to at least one of the tuner and the demodulator based on the transmission parameter data.

* * * * *